United States Patent
Han

(10) Patent No.: US 10,708,395 B1
(45) Date of Patent: Jul. 7, 2020

(54) MOBILE TERMINAL, SCREEN CONTROL METHOD, SCREEN CONTROL DEVICE AND STORAGE MEDIUM

(71) Applicant: Beijing Xiaomi Mobile Software Co., Ltd., Beijing (CN)

(72) Inventor: Gaocai Han, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 16/582,102

(22) Filed: Sep. 25, 2019

(30) Foreign Application Priority Data

Apr. 19, 2019 (CN) .......................... 2019 1 0319763

(51) Int. Cl.
- H04M 1/02 (2006.01)
- H05K 5/02 (2006.01)
- H05K 5/00 (2006.01)

(52) U.S. Cl.
CPC ....... *H04M 1/0237* (2013.01); *H04M 1/0268* (2013.01); *H05K 5/0017* (2013.01); *H05K 5/0217* (2013.01)

(58) Field of Classification Search
CPC .................................................. H04M 1/0268
See application file for complete search history.

(56) References Cited

U.S. PATENT DOCUMENTS

| | | | |
|---|---|---|---|
| 2004/0198474 A1* | 10/2004 | Jung | H04M 1/0212 455/575.1 |
| 2012/0212433 A1 | 8/2012 | Lee et al. | |
| 2012/0307423 A1* | 12/2012 | Bohn | G06F 1/1641 361/679.01 |
| 2012/0314400 A1* | 12/2012 | Bohn | G09F 9/301 362/97.1 |
| 2018/0292860 A1* | 10/2018 | Siddiqui | G06F 1/1652 |

FOREIGN PATENT DOCUMENTS

| | | |
|---|---|---|
| CN | 105635360 A | 6/2016 |
| CN | 106847103 A | 6/2017 |
| CN | 206657595 U | 11/2017 |
| JP | 2005309086 A | 11/2005 |
| WO | WO 2016/018300 A1 | 2/2016 |

OTHER PUBLICATIONS

International Search Report of PCT Application No. PCT/CN2019/098350, dated Jan. 15, 2020.
Extended European Search Report for Application No. 19206115.8, dated Apr. 6, 2020.

\* cited by examiner

*Primary Examiner* — Hsinchun Liao
(74) *Attorney, Agent, or Firm* — Finnegan, Henderson, Farabow, Garrett & Dunner, L.L.P.

(57) ABSTRACT

A mobile terminal includes: a body including a front surface and a back surface; a display screen including a first display region, a second display region, and a third display region connected sequentially, wherein the first display region is disposed on the front surface, and the second display region is made of a flexible material; and a first driving component, disposed on the body and connected with a first slider through a first telescopic part. In the present disclosure, by being provided with the driving component and the telescopic part inside the mobile terminal, and the driving component being controlled to drive the telescopic part to push or pull the slider, the display screen is expanded or contracted, thereby realizing automatic expansion or contraction of a flexible display screen without manual operation by a user.

15 Claims, 5 Drawing Sheets

US 10,708,395 B1

MOBILE TERMINAL, SCREEN CONTROL METHOD, SCREEN CONTROL DEVICE AND STORAGE MEDIUM

CROSS-REFERENCE TO RELATED APPLICATIONS

The present application is based on and claims priority to the Chinese Patent Application No. 201910319763.5, filed Apr. 19, 2019, the entire contents of which are hereby incorporated by reference.

TECHNICAL FIELD

The present disclosure relates to the technical field of terminals, in particular to a mobile terminal, a screen control method, a screen control device and a storage medium.

BACKGROUND

With the development of terminal technology, a flexible display screen has appeared. The flexible display screen is widely used due to its ability to be bended and deformed.

In the related art, a foldable display screen is a main application of the flexible display screen. When a user wants to use a larger display screen, the user can manually expand the screen, when the user wants to use the normal display screen, the user can manually fold back the expanded screen.

However, the expanding and folding of the display screen in the related art may require manual operation by a user, which may result in inconvenience.

SUMMARY

The present disclosure provides a mobile terminal, a screen control method, a screen control device and a storage medium.

According to a first aspect of the embodiments of the present disclosure, a mobile terminal is provided, including: a body including a front surface and a back surface; a display screen including a first display region, a second display region, and a third display region connected sequentially, wherein the first display region is disposed on the front surface, and the second display region is made of the flexible material; and a first driving component, disposed on the body and connected with a first slider through a first telescopic part; wherein, in a process that a state of the third display region is changed from an inward contraction state to an outward expansion state, the first driving component drives the first telescopic part to push the first slider outward, so that the third display region is turned from the back surface of the body to the front surface of the body; and in the process that the state of the third display region is changed from the outward expansion state to the inward contraction state, the first driving component drives the first telescopic part to pull the first slider inward, so that the third display region is folded from the front surface of the body to the back surface of the body.

According to a second aspect of the embodiments of the present disclosure, a screen control method is provided, applied to the mobile terminal according to the first aspect, including: receiving a screen expansion instruction; and controlling the first driving component according to the screen expansion instruction, to drive the first telescopic part to push the first slider outward, so that the third display region is turned from the back surface of the body to the front surface of the body.

According to a third aspect of the embodiments of the present disclosure, a screen control device is provided, applied to the mobile terminal according to the first aspect, including: a processor, and a memory storing instructions executable by the processor, wherein the processor is configured to receive a screen expansion instruction; and control the first driving component according to the screen expansion instruction, to drive the first telescopic part to push the first slider outward, so that the third display region is turned from the back surface of the body to the front surface of the body.

According to a fourth aspect of the embodiment of the present disclosure, a non-transitory computer readable storage medium is provided. When instructions stored on the storage medium is executed by a processor, the method according to the second aspect is implemented.

The technical solutions provided by the embodiments of the present disclosure may include the following beneficial effects.

By being provided with the driving component and the telescopic part inside the mobile terminal, and the driving component being controlled to drive the telescopic part to push or pull the slider, the display screen is expanded or contracted, thereby realizing automatic expansion or contraction of the flexible display screen without manual operation by a user, which is highly convenient.

It should be understood that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure.

DETAILED DESCRIPTION

Exemplary embodiments will be described in detail herein, examples of which are illustrated in the accompanying drawings. The following description refers to the same or similar elements in the different figures unless otherwise indicated. The embodiments described in the following exemplary embodiments do not represent all embodiments consistent with the present disclosure. Instead, they are merely examples of devices and methods consistent with aspects of the disclosure.

Figure 1:
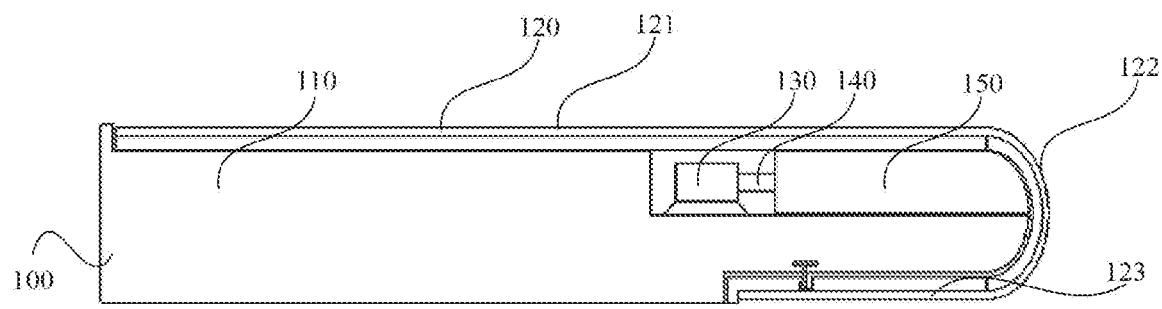
FIG. 1 is a schematic diagram of a mobile terminal according to an exemplary embodiment.
Figure 2:
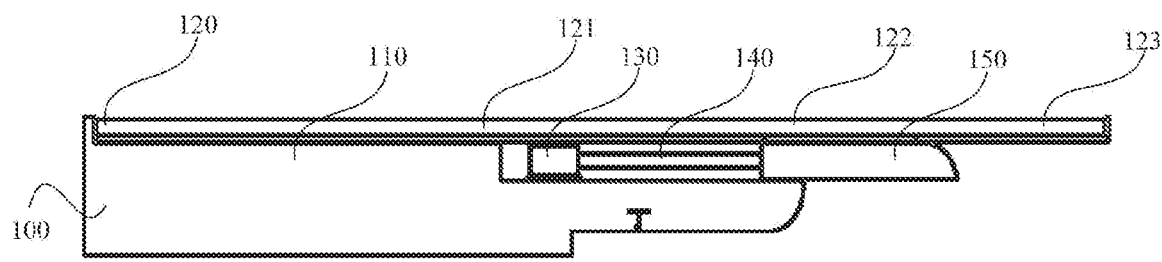
FIG. 2 is a schematic diagram of a mobile terminal according to another exemplary embodiment.

FIGS. 1 and 2 are schematic diagrams of a mobile terminal 100 according to exemplary embodiments. In FIG. 1, a display screen 120 of the mobile terminal 100 is in a contracted state; and in FIG. 2, the display screen 120 of the mobile terminal 100 is in an expansion state. Referring to FIGS. 1 and 2, the mobile terminal 100 includes: a body 110, the display screen 120, and a first driving component 130.

The body 110 includes a front surface of the body 110 and a back surface of the body 110.

The body 110 is a main body of the mobile terminal 100. For example, the body 110 has a hexahedral shape, and a part of edges or corners of the hexahedron may be formed with arc-shaped chamfers. The front surface of the body 110 may be rectangular with round angles or rectangular with right angles. In the embodiment of the present disclosure, the body 110 may be used to support the display screen 120. A main chip and other main components may be accommodated in the body 110. A user may interact with the display screen 120 on the front surface of the body 110.

The display screen 120 includes a first display region 121, a second display region 122, and a third display region 123, which are connected in sequence, wherein the first display region 121 is disposed on the front surface, and the second display region 122 is made of flexible material;

The display screen 120 is used to display images and colors. For example, the display screen 120 is a touch display screen, and the touch display screen has a function of receiving a touch operation (operations such as a click, a slide, and a press) of the user in addition to a display function. Also for example, the display screen 120 may be an organic light-emitting diode (OLED) screen.

In an exemplary embodiment, the second display region 122 is made of the flexible material, and the first display region 121 or the third display region 123 may be made of the flexible material or a rigid material. When the first display region 121 and the third display region 123 are made of the flexible material, the display screen 120 is a complete flexible display screen. The flexible display screen refers to a display screen which can be bent and has flexibility, and the flexible display screen can change the screen shape by bending, folding and the like.

In an exemplary embodiment, the first display region 121, the second display region 122, and the third display region 123 are three different display regions of the display screen 120, instead of three different display screens, and there is no splicing gap between two adjacent display regions.

The first driving component 130 is disposed on the body 110 and connected to a first slider 150 through a first telescopic part 140.

In the embodiment of the present disclosure, the first driving component 130 may convert electric energy into mechanical energy so that the first telescopic part 140 can push or pull the first slider 150 to move. For example, the first drive assembly 130 is a motor.

The first telescopic part 140 refers to a member that can be telescopic. For example, the first telescopic part 140 may be a connecting rod, and may also be other members having the telescopic property. The type of the first telescopic part 140 is not limited in the embodiment of the present disclosure.

In the embodiment of the disclosure, in a process that a state of the third display region 123 is changed from an inward contraction state to an outward expansion state, the first driving component 130 drives the first telescopic part 140 to push the first slider 150 outward, so that the first slider 150 puts the third display region 123 in motion to be turned from the back surface of the body 110 to the front surface of the body 110. The mobile terminal 100 changes from the state shown in FIG. 1 to the state shown in FIG. 2.

In the process that the state of the third display region 123 is changed from the outward expansion state to the inward contraction state, the first driving component 130 drives the first telescopic part 140 to pull the first slider 150 inward, so that the third display region 123 is folded from the front surface of the body 110 to the back surface of the body 110. The mobile terminal 100 changes from the state shown in FIG. 2 to the state shown in FIG. 1.

In the expansion process of the third display region 123, the first driving component 130 drives the first telescopic part 140 to push the first slider 150 outward, so that the first slider 150 moves in a direction away from the body 110, and when the first slider 150 is moving, the second display region 122 is put in motion by the first slider 150, and then the third display region 123 is put in motion by the second display region 122, thus the third display region 123 is turned from the back surface of the body 110 to the front surface of the body 110, thereby realizing the expansion of the display screen 120. When the third display region 123 is in the outward expansion state, the display area of the screen of the mobile terminal 100 increases. The technical solution provided by the embodiment of the present disclosure increases the display area of the screen of the mobile terminal 100 and also convenience of carrying the mobile terminal 100.

In the contraction process of the third display region 123, the first driving component 130 drives the first telescopic part 140 to pull the first slider 150 inward, so that the first slider 150 moves toward the direction close to the body 110, and when the first slider 150 is moving, the second display region 122 is put in motion by the first slider 150, and then the third display region 123 is put in motion by the second display region 122, thus the third display region 123 is folded from the front surface of the body 110 to the back surface of the body 110, thereby realizing the contraction of the display screen 120.

In an exemplary embodiment, a back surface of the second display region 122 is a bendable support part. The bendable support part serves to support the second display region 122 in the case that the third display region 123 is in an outward expansion state. The bendable support part may be any one of silicone gel, thermoplastic polyurethanes (TPU) rubber, or a hinge.

In an exemplary embodiment, in the case that the third display region 123 is in the outward expansion state, an upper surface of the first slider 150 closely contacts with the back surface of the second display region 122. At this time, the first slider 150 can support the second display region 122 well, so as to avoid the screen unevenness caused by no support when the second display region 122 is in the expansion state.

In an exemplary embodiment, in the case that the third display region 123 is in the inward contraction state, a back surface of the third display region 123 closely contacts with a first region on the back surface of the body 110.

In an exemplary embodiment, a first connection portion is disposed on a first region of the back surface of the body 110, and a second connection portion matched with the first connection portion is disposed on the back surface of the third display region 123; in the case that the third display region 123 is in the inward contraction state, the first connection portion and the second connection portion are connected. The first connection portion and the second connection portion may serve as a fixing function for the third display region 123 when the third display region 123 is in the inward contraction state.

Figure 3:
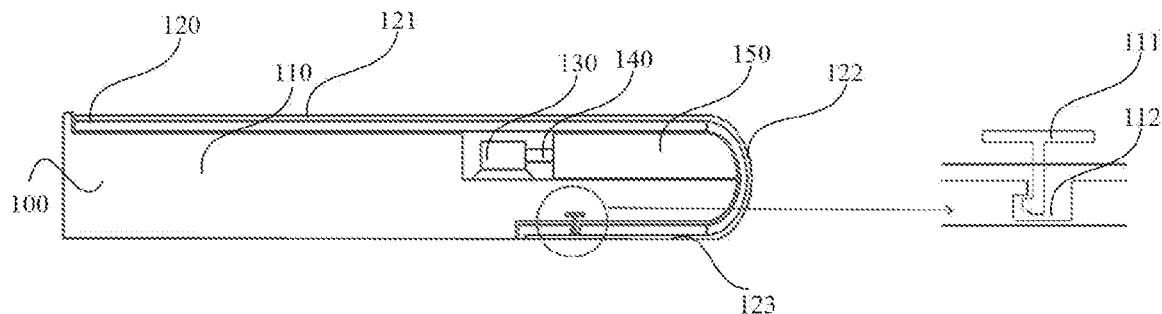
FIG. 3 is a schematic diagram of a snap connection according to an exemplary embodiment.

In an exemplary embodiment, a snap connection is formed between the first connection portion and the second connection portion. For example, as shown in FIG. 3, the first connection portion is a clip 111, and the second connection portion is a clip slot 112 matched with the clip 111. The clip 111 may be connected to a motor by which the clip 111 is inserted into the clip slot 112 or the clip 111 is disengaged from the clip slot 112. In the case that the third display region 123 is changed from the outward expansion state to the inward contraction state, the user may manually fold the third display region 123 back to the position where the third display region 123 is in the contracted state, and insert the clip 111 into the clip slot 112.

In an exemplary embodiment, a magnetic connection is formed between the first connection portion and the second connection portion. For example, the first connection portion and the second connection portion are both permanent magnets, and the third display region 123 can be extended outward by increasing the distance between the body 110 and the third display region 123; the third display region 123 can be contracted inward by reducing the distance between the body 110 and the third display region 123. In an exemplary embodiment, one of the first connection portion and the second connection portion is a permanent magnet, and the other one is a soft magnet. By outputting a current to the soft magnet, a repulsive force is generated between the first connection portion and the second connection portion, and then the first connection portion and the second connection portion are separated, thereby enabling the third display region 123 to be extended outward.

In an exemplary embodiment, a camera is disposed in a first region of the back surface of the body 110. When a picture is being taken, the third display region 123 is expanded outward, and the mobile terminal 100 exposes the camera to meet requirements for the user taking pictures. By setting the camera in the first region on the back surface of the body 110, the camera is not exposed all times, and the camera can be protected.

Figure 4:
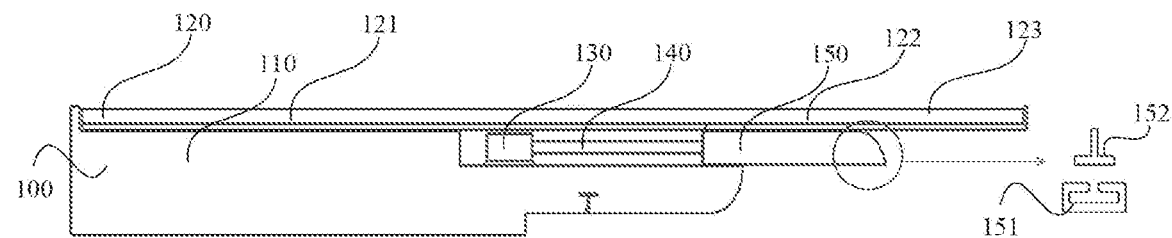
FIG. 4 is a schematic diagram of a mobile terminal according to another exemplary embodiment.

As shown in FIG. 4, a sliding groove 151 is formed on an upper surface of the first slider 150, and a sliding part 152 matched with the sliding groove 151 is formed on a back surface of the first display region 121. The arrangement of the sliding groove 151 and the sliding part 152 can prevent the first display region 121 from being detached from the first slider 150 and reduce the movement resistance of the first slider 150 to some extent.

In an exemplary embodiment, the mobile terminal 100 further includes a limiting mechanism. The limiting mechanism is used for limiting a maximum displacement of the first slider 150 in the process that the state of the third display region 123 is changed from the inward contraction state to the outward expansion state. In the above manner, the displacement of the first slider 150 can be prevented from being excessively large and the screen can be prevented from being stretched too much to cause damage.

In an exemplary embodiment, the limiting mechanism may include a magnetic element and a hall sensor. The magnetic element may include a permanent magnetic element and a soft magnetic element; the hall sensor is a magnetic field sensor made according to the hall effect. In the embodiment of the present disclosure, the hall sensor may indirectly measure the displacement between the magnetic element and the hall sensor, i.e., the displacement between the body 110 and the first slider 150. In an exemplary embodiment, the magnetic element is disposed on the body 110, and the hall sensor is disposed on the first slider 150; or, the magnetic element is disposed on the first slider 150, and the hall sensor is disposed on the body 110. When the displacement between the body 110 and the first slider 150 is greater than a preset threshold, the mobile terminal 100 controls the first driving component 130 to stop operating, so that the first slider 150 stops moving, and then the third display region 123 stops expanding.

The limiting mechanism is disposed in the mobile terminal 100, so as to protect the display screen 120 well and avoid the problem of damage of the display screen 120 caused by excessive expansion.

In an exemplary embodiment, a limiting function of the limiting mechanism also may be realized by setting a telescopic length of the first telescopic part 140.

In the technical solution provided by the embodiment of the present disclosure, by being provided with the driving component and the telescopic part inside the mobile terminal, and the driving component being controlled to drive the telescopic part to push or pull the slider, the display screen is expanded or contracted, thereby realizing automatic expansion or contraction of the flexible display screen without manual operation by the user, and user convenience is improved.

Figure 5:
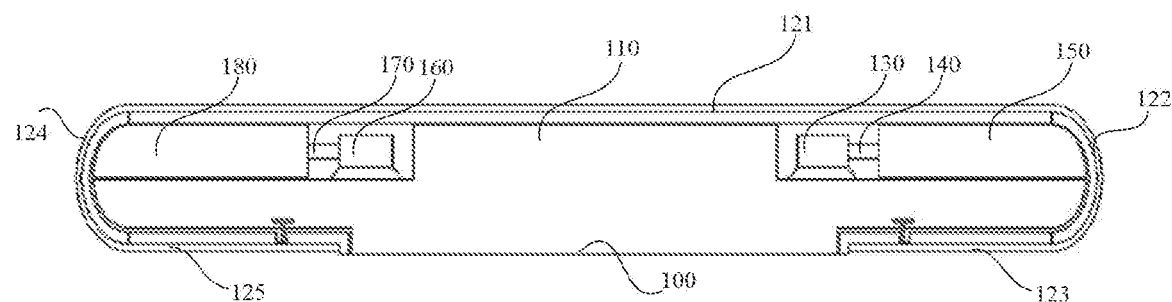
FIG. 5 is a schematic diagram of a mobile terminal according to another exemplary embodiment.

FIG. 5 is a schematic diagram showing the mobile terminal 100 according to another exemplary embodiment. The mobile terminal 100 includes: the device body 110, the display screen 120, the first driving component 130, and a second driving component 160.

The display screen 120 includes a first display region 121, a second display region 122, a third display region 123, a fourth display region 124, and a fifth display region 125.

In the embodiment of the present disclosure, the first display region 121, the fourth display region 124 and the fifth display region 125 are sequentially connected, and the fourth display region 124 and the second display region 122 are respectively located on two sides of the first display region 121, and the fourth display region 124 is made of flexible material. That is, the fifth display region 125, the fourth display region 124, the first display region 121, the second display region 122, and the third display region 123 are sequentially connected.

In an exemplary embodiment, the fifth display region 125, the fourth display region 124, the first display region 121, the second display region 122, and the third display region 123 are five different display regions of the display screen 120, instead of five different display screens, and there is no splicing gap between two adjacent display regions.

For example, the first display region 121, the third display region 123 or the fifth display region 125 may be made of the flexible material, or may be made of the rigid material. When the first display region 121, the third display region 123 and the fifth display region 125 are all made of the flexible material, the display screen 120 is a complete flexible display screen.

The second driving component 160 is disposed on the body 110 and connected to a second slider 180 through a second telescopic part 170.

In the embodiment of the present disclosure, the second driving component 160 may convert electric energy into mechanical energy so that the second telescopic part 170 can push or pull the second slider 180 to move. For example, the second driving component 160 is a motor.

The second telescopic part 170 refers to a member that can be telescopic. For example, the second telescopic part 170 may be a connecting rod, and may also be other members having the telescopic property. The type of the second telescopic part 170 is not limited in the embodiment of the present disclosure.

In a process that a state of the fifth display region 125 is changed from an inward contraction state to an outward expansion state, the second driving component 160 drives the second telescopic part 170 to push the second slider 180 outward, so that the second slider 180 puts the fifth display region 125 in motion to be turned from the back surface of the body 110 to the front surface of the body 110.

In the process that the state of the fifth display region 125 is changed from the outward expansion state to the inward contraction state, the second driving component 160 drives the second telescopic part 170 to pull the second slider 180 inward, so that the fifth display region 125 is folded from the front surface of the body 110 to the back surface of the body 110.

For the description of the expansion and contraction process of the fifth display region 125, reference can be made to the description of the expansion and contraction process of the third display region 123, which is not repeated here.

In an exemplary embodiment, the back surface of the fourth display region 124 is a bendable support part. The bendable support part may be any one of silicone gel, TPU rubber, or a hinge.

In an exemplary embodiment, in the case that the fifth display region 125 is in the inward contraction state, a back surface of the fifth display region 125 closely contacts with a second area on the back surface of the body 110.

A third connection portion is disposed on the second region of the back surface of the body 110, and a fourth connection portion matched with the third connection portion is disposed on the back surface of the fifth display region 125; in the case that the fifth display region 125 is in the inward contraction state, a connection between the third connection portion and the fourth connection portion is formed.

For the description of the third connection portion and the fourth connection portion, reference can be made to the above description of the first connection portion and the second connection portion, which is not repeated here.

In the case that the fifth display region 125 is in the outward expansion state, the upper surface of the second slider 180 closely contacts with the back surface of the fourth display region 124.

The third display region 123 and the fifth display region 125 can be expanded simultaneously, and the display area of the screen is the largest at this time. In an exemplary embodiment, the third display region 123 may be expanded and the fifth display region 125 may be contracted. In an exemplary embodiment, the third display region 123 may be contracted and the fifth display region 125 may be expanded. The expansion or contraction of the third display region 123 and the fifth display region 125 is determined by the display demand of the user, and when the user wants the maximum display area, the third display region 123 and the fifth display region 125 may be expanded simultaneously. In the technical solution provided by the embodiment of the present disclosure, the display modes are diversified.

In the technical solution provided by the embodiment of the present disclosure, by setting the driving components and the telescopic parts on both sides, the display area is increased, and the display modes are diversified, which can better meet the display requirements of the user.

Figure 6:
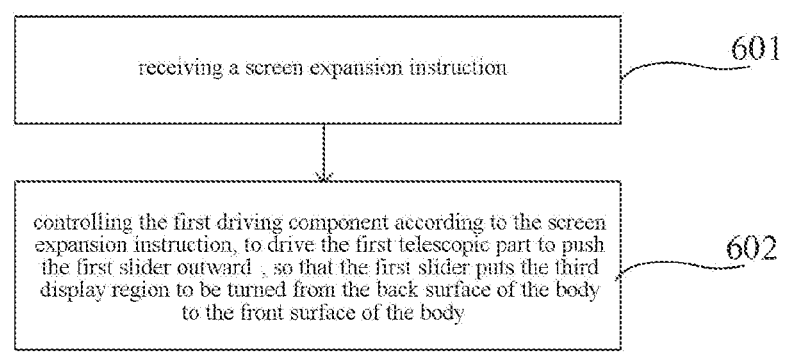
FIG. 6 is a flowchart of a screen control method according to an exemplary embodiment.

FIG. 6 is a flowchart of a screen control method according to an exemplary embodiment. The method may be applied to the mobile terminal described above, and may include the following steps.

In step 601, a screen expansion instruction is received.

The screen expansion instruction is an operation instruction for expanding the display screen. The screen expansion instruction may be triggered by a system interaction button in the display screen, or may be triggered by an entity or a touch key disposed on the mobile terminal. In an exemplary embodiment, the screen expansion instruction may also be triggered by a voice or a gesture of the user. The embodiment of the present disclosure does not limit the triggering manner of the screen expansion instruction.

In step 602, the first driving component is controlled according to the screen expansion instruction, to drive the first telescopic part to push the first slider outward, so that the first slider puts the third display region in motion to be turned from the back surface of the body to the front surface of the body.

In the expansion process of the third display region, the first driving component drives the first telescopic part to push the first slider outward, so that the first slider moves in a direction away from the body, and when the first slider is moving, the second display region is put by the first slider, and then the third display region is put by the second display region, thus the third display region is turned from the back surface of the body to the front surface of the body, thereby realizing the expansion of the display screen.

For example, when the user wants to view a video using a larger display area, the user may click a certain system button on the display screen, triggering the screen expansion instruction. When the mobile terminal receives the screen expansion instruction, the third display region is expanded, and the mobile terminal provides a larger display area for the user to view the video.

Figure 7:
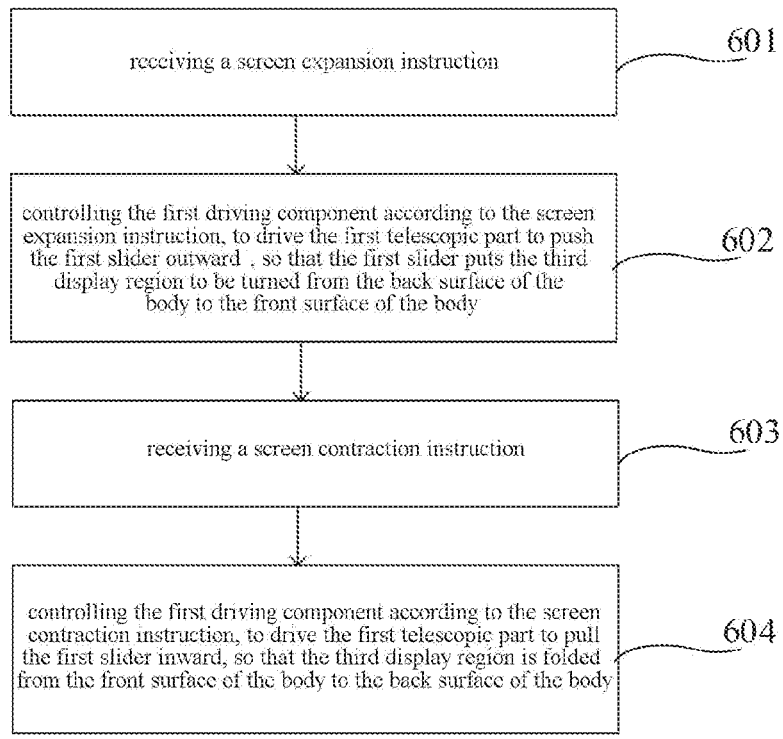
FIG. 7 is a flowchart of a screen control method according to another exemplary embodiment.

In an exemplary embodiment, as shown in FIG. 7, the method further includes the following steps 603 and 604.

In step 603, a screen contraction instruction is received.

The screen contraction instruction is an operation instruction for contracting the display screen. The screen contraction instruction may be triggered by a system interaction button in the display screen, or may be triggered by an entity or a touch key disposed on the mobile terminal. In an exemplary embodiment, the screen contraction instruction may also be triggered by a voice or a gesture of the user. The embodiment of the present disclosure does not limit the triggering manner of the screen contraction instruction.

In step 604, the first driving component is controlled according to the screen contraction instruction, to drive the first telescopic part to pull the first slider inward, so that the third display region is folded from the front surface of the body to the back surface of the body.

In the contraction process of the third display region, the first driving component drives the first telescopic part to pull the first slider inward, so that the first slider moves towards the direction close to the body, and when the first slider is moving, the second display region is put in motion by the first slider, and then the third display region is put in motion by the second display region, thus the third display region is folded from the front surface of the body to the back surface of the body, thereby realizing the contraction of the display screen.

For example, after the user views the video, the user does not need a larger display area, and the user clicks the system button on the display screen again to trigger the screen contraction instruction. After the mobile terminal receives the screen contraction instruction, the third display region is contracted, and the display area of the mobile terminal returns to normal.

In the technical solutions provided by the embodiment of the present disclosure, by being provided with the driving component and the telescopic part inside the mobile terminal, and the driving component being controlled to drive the telescopic part to push or pull the slider, the display screen is expanded or contracted, thereby realizing automatic expansion or contraction of the flexible display screen without manual operation by the user, which is highly convenient.

Figure 8:
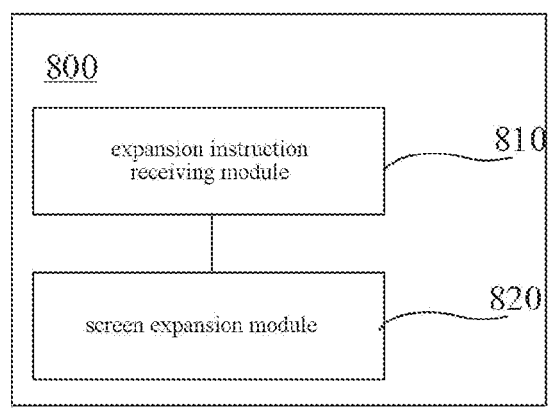
FIG. 8 is a block diagram of a screen control device according to an exemplary embodiment.

FIG. 8 is a block diagram of a screen control device 800 according to an exemplary embodiment. The device 800 is applied to the mobile terminal as described above, and the device can be the mobile terminal as described above, and can also be provided in the mobile terminal. The device 800 has the functions of implementing the embodiments of the method, and the functions can be implemented by hardware, software, or a combination of hardware and software. The device 800 may include: an expansion instruction receiving module 810 and a screen expansion module 820.

The expansion instruction receiving module 810 is configured to receive a screen expansion instruction.

The screen expansion module 820 is configured to control the first driving component to drive the first telescopic part to push the first slider outward according to the screen expansion instruction, so that the first slider puts the third display region in motion to be turned from the back surface of the body to the front surface of the body.

In the technical solution provided by the embodiment of the present disclosure, by being provided with the driving component and the telescopic part inside the mobile terminal, and the driving component being controlled to drive the telescopic part to push or pull the slider, the display screen is expanded or contracted, thereby realizing automatic expansion or contraction of the flexible display screen without manual operation by the user, which is highly convenient.

Figure 9:
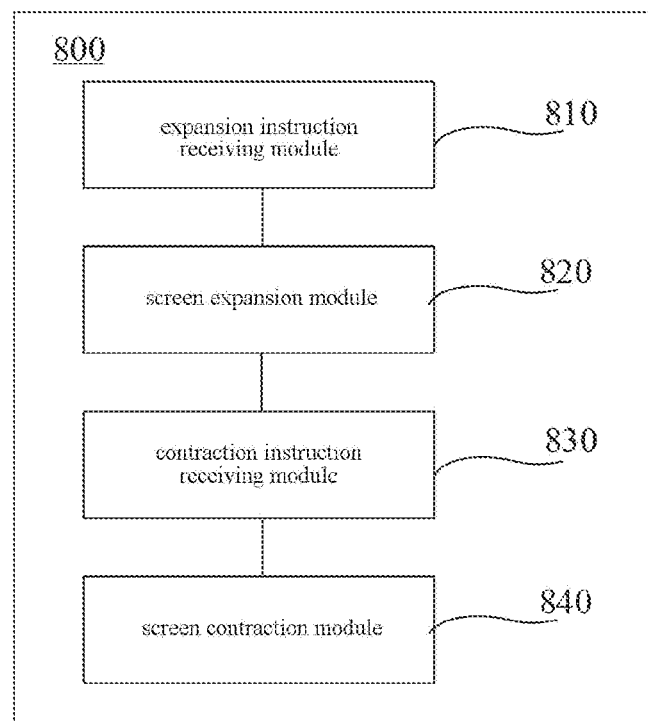
FIG. 9 is a block diagram of a screen control device according to another exemplary embodiment.

In an exemplary embodiment, shown in FIG. 9, the device 800 further includes: a contraction instruction receiving module 830 and a screen contraction module 840.

The contraction instruction receiving module 830 is configured to receive a screen contraction instruction.

The screen contraction module 840 is configured to control the first driving component to drive the first telescopic part to pull the first slider inward according to the screen contraction instruction, so that the third display region is folded from the front surface of the body to the back surface of the body.

It should be noted that, when the device provided in the above embodiment implements its functions, the division of each functional module is only taken as an example for illustration, and in practical applications, the above functions can be assigned to different functional modules as needed. That is, the internal structure of the device is divided into different functional modules to implement all or part of the functions described above. In addition, the embodiments of the device and the method provided in the above embodiments belong to the same concept, and the specific implementation process is detailed in the embodiments of the method, which is not described in detail herein.

Figure 10:
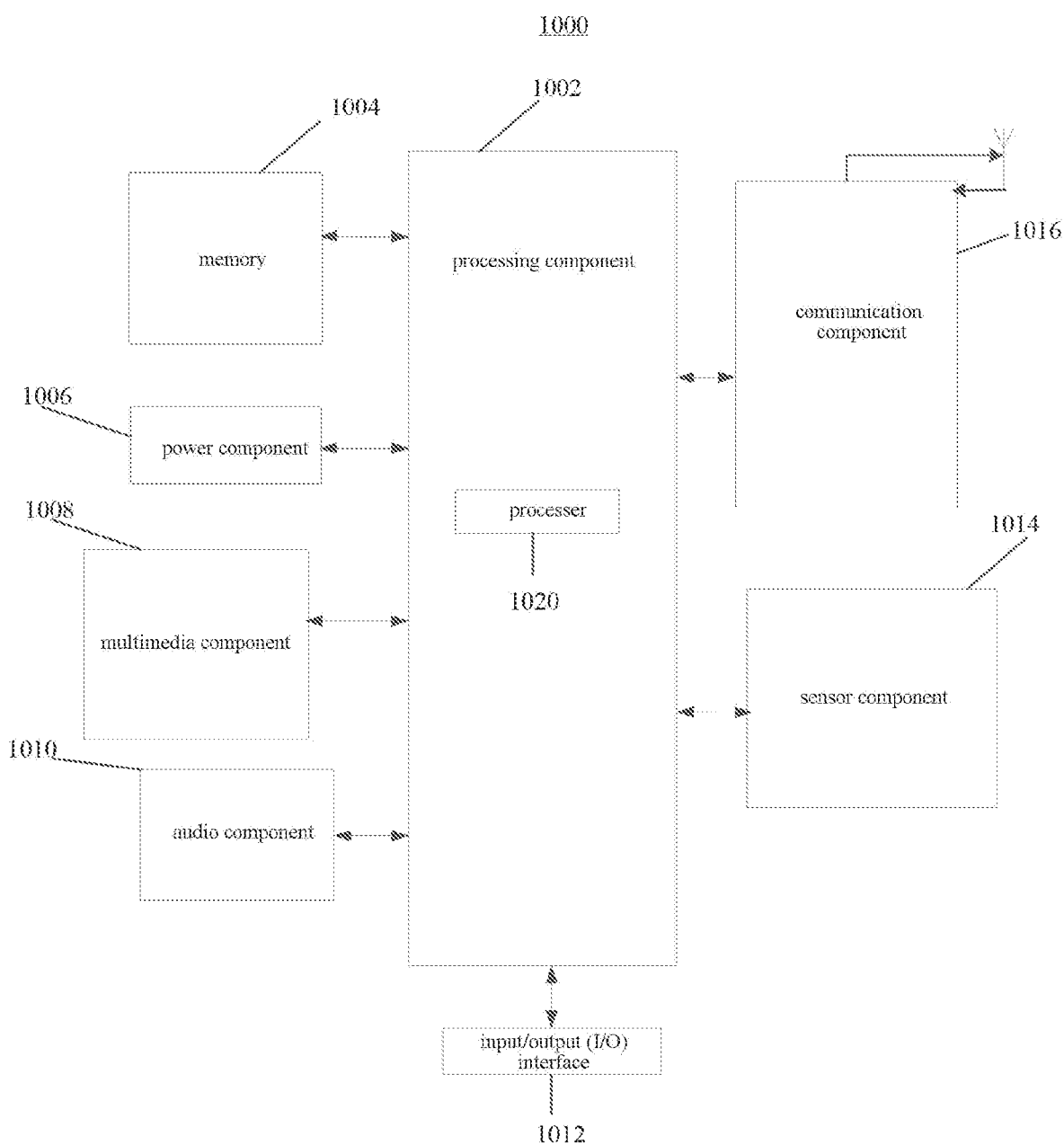
FIG. 10 is a block diagram of a screen control device according to another exemplary embodiment.

FIG. 10 is a block diagram showing a screen control device 1000 according to another exemplary embodiment. For example, the device 1000 is the mobile terminal as described above, for example, the device 1000 may be a mobile phone, a computer, a digital broadcast terminal, a messaging device, a game console, a tablet device, a medical device, an exercise device, a personal digital assistant, and the like.

Referring to FIG. 10, the device 1000 may include one or more of the following components: a processing component 1002, a memory 1004, a power component 1006, a multimedia component 1008, an audio component 1010, an input/output (I/O) interface 1012, a sensor component 1014, and a communication component 1016.

The processing component 1002 typically controls the overall operations of the device 1000, such as the operations associated with display, telephone calls, data communications, camera operations, and recording operations. The processing component 1002 can include one or more processors 1020 to execute instructions to perform all or part of the steps in the above described methods. Moreover, the processing component 1002 can include one or more modules to facilitate the interaction between the processing component 1002 and other components. For example, the processing component 1002 can include a multimedia module to facilitate the interaction between the multimedia component 1008 and the processing component 1002.

The memory 1004 is configured to store various types of data to support the operation of the device 1000. Examples of such data include instructions for any application or method operated on device 1000, such as the contact data, the phone book data, messages, pictures, videos, and the like. The memory 1004 can be implemented by any type of volatile or non-volatile storage device, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1006 provides power to various components of the device 1000. The power component 1006 can include a power management system, one or more power sources, and other components associated with the generation, management, and distribution of power in the device 1000.

The multimedia component 1008 includes a screen providing an output interface between the device 1000 and the user. In some embodiments, the screen can include a liquid crystal display (LCD) and a touch panel (TP). If the screen includes the touch panel, the screen can be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 1008 includes a front camera and/or a rear camera. When the device 1000 is in an operation mode, such as a photographing mode or a video mode, the front camera and/or the rear camera can receive external multimedia data. Each of the front camera and the rear camera may be a fixed optical lens system or have focus and optical zoom capability.

The audio component 1010 is configured to output and/or input an audio signal. For example, the audio component 1010 includes a microphone (MIC) configured to receive an external audio signal when the device 1000 is in an operation mode, such as a call mode, a recording mode, and a voice recognition mode. The received audio signal may be further stored in the memory 1004 or transmitted via the communication component 1016. In some embodiments, the audio component 1010 also includes a speaker for outputting the audio signal.

The I/O interface 1012 provides an interface between the processing component 1002 and peripheral interface modules, such as a keyboard, a click wheel, buttons, and the like. These buttons may include, but are not limited to, a home button, a volume button, a starting button, and a locking button.

The sensor component 1014 includes one or more sensors for providing status assessments of various aspects of the device 1000. For example, the sensor component 1014 can detect an open/closed status of the device 1000, relative positioning of components such as the display and the keypad of the device 1000. The sensor component 1014 can also detect a change in position of one component of the device 1000 or the device 1000, the presence or absence of user contact with the device 1000, an orientation, or an acceleration/deceleration of the device 1000, and a change in temperature of the device 1000. The sensor component 1014 can include a proximity sensor configured to detect the presence of nearby objects without any physical contact. The sensor component 1014 can also include a light sensor, such as a CMOS or CCD image sensor, configured to use in imaging applications. In some embodiments, the sensor component 1014 can also include an accelerometer sensor, a gyroscope sensor, a magnetic sensor, a pressure sensor, or a temperature sensor.

The communication component 1016 is configured to facilitate wired or wireless communication between the device 1000 and other devices. The device 1000 can access a wireless network based on a communication standard, such as WiFi, 4G or 5G, or a combination thereof. In an exemplary embodiment, the communication component 1016 receives broadcast signals or broadcast associated information from an external broadcast management system via a broadcast channel. In an exemplary embodiment, the communication component 1016 also includes a near field communication (NFC) module to facilitate short-range communications.

In an exemplary embodiment, the device 1000 may be implemented with one or more application specific integrated circuits (ASICs), digital signal processors (DSPs), digital signal processing devices (DSPDs), programmable logic devices (PLDs), field programmable Gate array (FPGA), controller, microcontroller, microprocessor or other electronic components to perform the screen control method above.

In an exemplar) embodiment, there is also provided a non-transitory computer-readable storage medium storing instructions, and the instructions may be executed by the processor 1020 of the terminal 1000 to perform the screen control method described above.

For example, the non-transitory computer readable storage medium may be a ROM, a random access memory (RAM), a CD-ROM, a magnetic tape, a floppy disc, and an optical data storage device.

The above description is only exemplary embodiments of the present disclosure, and is not intended to limit the present disclosure, and any modifications, equivalents, improvements, etc., made within the spirit and principles of the present disclosure should be included in the protection scope of the present disclosure.

What is claimed is:
1. A mobile terminal, comprising:
a body including a front surface and a back surface;
a display screen including a first display region, a second display region, and a third display region connected sequentially, wherein the first display region is disposed on the front surface of the body, and the second display region is made of a flexible material; and
a first driving component disposed on the body and connected with a first slider through a first telescopic part;
wherein,
in a process that a state of the third display region is changed from an inward contraction state to an outward expansion state, the first driving component drives the first telescopic part to push the first slider outward, so the third display region is turned from the back surface of the body to the front surface of the body; and
in a process that the state of the third display region is changed from the outward expansion state to the inward contraction state, the first driving component drives the first telescopic part to pull the first slider inward, so that the third display region is folded from the front surface of the body to the back surface of the body.

2. The mobile terminal of claim 1, wherein a bendable support part is provided under a back surface of the second display region.

3. The mobile terminal of claim 2, wherein the bendable support part is one of silicone gel, thermoplastic polyurethanes (TPU) rubber, or a hinge.

4. The mobile terminal of claim 1, wherein when the third display region is in the inward contraction state, a back surface of the third display region closely contacts with a first region on the back surface of the body.

5. The mobile terminal of claim 4, wherein,
a first connection portion is disposed on the first region on the back surface of the body;
a second connection portion matched with the first connection portion is disposed on the back surface of the third display region; and
when the third display region is in the inward contraction state, a connection between the first connection portion and the second connection portion is formed.

6. The mobile terminal of claim 5, wherein:
one of a snap connection or a magnetic connection is formed between the first connection portion and the second connection portion.

7. The mobile terminal of claim 4, wherein the first region on the back surface of the body is provided with a camera.

8. The mobile terminal of claim 1, wherein when the third display region is in the outward expansion state, an upper surface of the first slider is attached to a back surface of the second display region.

9. The mobile terminal of claim 1, wherein a sliding groove is formed on an upper surface of the first slider, and a sliding part matched with the sliding groove is formed on a back surface of the first display region.

10. The mobile terminal of claim 1, further comprising a limiting mechanism;
wherein the limiting mechanism limits a maximum displacement of the first slider in the process that the state of the third display region is changed from the inward contraction state to the outward expansion state.

11. The mobile terminal of claim 1, wherein,
the display screen further comprises a fourth display region and a fifth display region, wherein the first display region, the fourth display region, and the fifth display region are sequentially connected, and the fourth display region and the second display region are respectively located on first and second sides of the first display region, and the fourth display region is made of the flexible material;

the mobile terminal further comprises a second driving component disposed on the body and connected with a second slider through a second telescopic part;

wherein, in a process that a state of the fifth display region is changed from the inward contraction state to the outward expansion state, the second driving component drives the second telescopic part to push the second slider outward, so that the fifth display region is turned from the back surface of the body to the front surface of the body; and in the process that the state of the fifth display region is changed from the outward expansion state to the inward contraction state, the second driving component drives the second telescopic part to pull the second slider inward, so that the fifth display region is folded from the front surface of the body to the back surface of the body.

12. A screen control method, applied to the mobile terminal of claim 1, comprising:

receiving a screen expansion instruction; and controlling the first driving component according to the screen expansion instruction, to drive the first telescopic part to push the first slider outward, so that the third display region is turned from the back surface of the body to the front surface of the body.

13. The method of claim 12, further comprising:

receiving a screen contraction instruction; and controlling the first driving component according to the screen contraction instruction, to drive the first telescopic part to pull the first slider inward, so that the third display region is folded from the front surface of the body to the back surface of the body.

14. A screen control device, applied to the mobile terminal of claim 1, comprising:

a processor; and a memory storing instructions executable by the processor;

wherein the processor is configured to:

receive a screen expansion instruction; and control the first driving component according to the screen expansion instruction, to drive the first telescopic part to push the first slider outward, so that the third display region is turned from the back surface of the body to the front surface of the body.

15. The device of claim 14, wherein the processor is further configured to:

receive a screen contraction instruction; and control the first driving component according to the screen contraction instruction, to drive the first telescopic part to pull the first slider inward, so that the third display region is folded from the front surface of the body to the back surface of the body.

* * * * *